United States Patent [19]
Chye et al.

[11] 4,432,809
[45] Feb. 21, 1984

[54] METHOD FOR REDUCING OXYGEN PRECIPITATION IN SILICON WAFERS

[75] Inventors: Patrick W. Chye, Mountain View, Calif.; Eric W. Hearn, Wappingers Falls, N.Y.; Murlidhar V. Kulkarni, Fishkill, N.Y.; Gary Markovits, Poughkeepsie, N.Y.

[73] Assignee: International Business Machines Corporation, Armonk, N.Y.

[21] Appl. No.: 364,542
[22] PCT Filed: Dec. 31, 1981
[86] PCT No.: PCT/US81/01777
§ 371 Date: Mar. 10, 1982
§ 102(e) Date: Mar. 10, 1982
[87] PCT Pub. No.: WO83/02314
PCT Pub. Date: Jul. 7, 1983
[51] Int. Cl.³ .................. H01L 21/322; H01L 21/324
[52] U.S. Cl. .................. 148/1.5; 29/576 T; 432/18
[58] Field of Search ............ 29/576 T; 148/1.5; 432/12, 18, 24

[56] References Cited

U.S. PATENT DOCUMENTS

| | | | |
|---|---|---|---|
| 3,015,591 | 1/1962 | Zaratkiewicz et al. | 148/1.5 |
| 3,181,847 | 5/1965 | Hauth, Jr. et al. | 263/41 |
| 3,623,712 | 11/1971 | McNeilly et al. | 263/41 |
| 3,723,053 | 3/1973 | Myers et al. | 432/6 |
| 3,737,282 | 6/1973 | Hearn et al. | 148/1.5 X |
| 3,811,829 | 5/1974 | Wesson et al. | 432/253 |
| 3,936,328 | 2/1976 | Nakata | 148/171 |
| 4,220,483 | 9/1980 | Cazcarra | 148/1.5 |
| 4,350,537 | 9/1982 | Young et al. | 29/585 X |

OTHER PUBLICATIONS

Poponiak, M. R. et al., "Gettering Utilizing Implant Damage and Highly Disordered Epitaxial Layer" in *IBM-TDB*, vol 19, No. 6, Nov. 1976, p. 2052.

Colclaser, Roy A., *Microelectronics: Processing and Device Design*, John Wiley & Sons, 1980, p. 64.

W. Kaiser et al, "Oxygen Content of Silicon Single Crystals", Journal of Applied Physics, vol. 28, No. 8, pp. 882-887, Aug. 1957.

E. G. Grochowski et al, "Slow Cooling to Minimize Distortion in Vertical Batch Processing of Large Wafers", IBM Technical Disclosure Bulletin, vol. 14, No. 5, Oct. 1971, p. 1640.

E. Biedermann, "Producing Silicon Semiconductor Wafers with a High-Internal Getter Density and a Surface Layer Free from Lattice Defects", IBM Technical Disclosure Bulletin, vol. 19, No. 4, Sep. 1976, p. 1295.

A. Guillot et al, "Method for Increasing the Critical Resolved Shear Stress in Silicon Wafers", IBM Technical Disclosure Bulletin, vol. 22, No. 3, Aug. 1979, p. 1036.

V. Cazcarra, "Characterization Method of Silicon Wafers Based on Oxygen Precipitation", IBM Technical Disclosure Bulletin, vol. 23, No. 4, Sep. 1980, pp. 1465-1466.

*Primary Examiner*—Brian E. Hearn
*Assistant Examiner*—Alan E. Schiavelli
*Attorney, Agent, or Firm*—Mitchell S. Bigel

[57] ABSTRACT

The rate of oxygen precipitation in a semiconductor wafer during heat treatment is reduced by quickly inserting the wafer into a furnace which has been preheated to the heat treatment temperature. After performing the heat treatment, the wafer is slowly cooled to prevent warpage or cracking.

12 Claims, 4 Drawing Figures

QUICK INSERTION/RAMP DOWN TEMPERATURE

METHOD FOR REDUCING OXYGEN PRECIPITATION IN SILICON WAFERS

TECHNICAL FIELD

This invention generally relates to the manufacture of silicon semiconductor wafers and more particularly to a method of reducing oxygen precipitation in silicon wafers.

The manufacture of semiconductor devices (e.g., transistors) on the surface of a silicon wafer is well known in the art. Present day efforts have concentrated on device miniaturization to achieve high device density. As the size of semiconductor devices shrink, it becomes extremely important to eliminate impurities at the surface of the silicon wafer where the devices are formed. For example, the presence of even minute amounts of metal impurities at the surface of the semiconductor wafer can cause shorting of devices or degradation of device operation.

One method of achieving an impurity free zone at the surface of a silicon wafer is by using ultra pure environments and inert equipment for all semiconductor processing steps. It will be recognized, however, that the introduction of some impurities is almost inevitable as the silicon wafer undergoes various manufacturing processes.

A second method of achieving an impurity free surface zone is by utilizing the phenomenon known as "gettering". Gettering occurs when a defect or impurity is deliberately introduced into the semiconductor crystalline structure. The defect or impurity acts as an internal trap for any subsequent impurities introduced into the semiconductor by attracting subsequent impurities thereto.

A common method of obtaining gettering is by forming a region of precipitated oxygen inside the silicon wafer. The internal precipitation region acts as a trap for any impurities introduced into the surface of the silicon wafer during subsequent processing. The impurities are attracted to the internal precipitation region and drawn away from the wafer surface thus ensuring an impurity free device region. An example of a method for producing a silicon wafer having a high internal getter density and a surface layer free from precipitated oxygen may be found in IBM Technical Disclosure Bulletin, Vol. 19, No. 4, September 1976, p. 1295 to Biedermann. Disclosed is a high temperature wafer annealing process for dissolving precipitated oxygen near the surface and diffusing the oxygen off the wafer.

From the above description it will be realized that gettering will only be effective if the internal gettering region does not extend near the wafer surface. If the internal gettering reigion extends near the surface impurities introduced in subsequent processing steps will not be drawn away from the surface by the gettering region. Moreover, the precipitated oxygen in the gettering region near the surface will act as an impurity and have an adverse effect on device operation.

Unfortunately, high temperature (i.e., greater than about 800° C.) processing of a silicon wafer causes interstitial (dissolved) oxygen in the wafer to precipitate, thereby enlarging the internal gettering region. Each high temperature processing step precipitates more oxygen until the internal gettering region extends into the device region, and degrades device operation. Precipitation during high temperature processing is particularly a problem with silicon wafers having a high (e.g., greater than about 33 parts per million) interstitial oxygen content, as greater amounts of oxygen precipitates with each high temperature step, and enlarges the internal gettering region into the device region.

The prior art has heretofore not found a way to reduce oxygen precipitation during high temperature processing steps. For example, the surface diffusion method disclosed in the above-mentioned IBM Technical Disclosure Bulletin to Biedermann will only successfully diffuse low concentrations of precipitated oxygen near the wafer surface. When the internal gettering region extends near the wafer surface, the resultant high precipitated oxygen concentration cannot be diffused out. As a consequence of these problems, wafers with a high interstitial oxygen content were heretofore discarded, or used for producing low performance devices.

We have discovered that the rate of oxygen precipitation in a semiconductor wafer may be significantly reduced by modifying the form of the temperature cycle of the high temperature processing steps from that heretofore employed. The duration and temperature of the high temperature processing steps are not modified, but rather the heat up and cool down portions of the temperature cycle are modified, to reduce oxygen precipitation.

BACKGROUND ART

The prior art has not heretofore recognized that the form of temperature cycle employed for high temperature processing can have any effect on the rate of oxygen precipitation.

In the early days of semiconductor manufacturing, the form of temperature cycle employed for high temperature processing was not known to have any significance with regard to the semiconductor wafer. To treat a wafer at a given temperature, the wafer was merely thrust into a hot furnace for the requisite time and then pulled out.

However, it was soon realized that this form of temperature cycle was responsible for cracks or warpage in the semiconductor wafer. Subsequent developments have attempted to control wafer warping or cracking by modifying the form of the temperature cycle to slowly heat the semiconductor ("ramp up") prior to high temperature processing and slowly cool the semiconductor ("ramp down") after high temperature processing. For example, in U.S. Pat. No. 3,723,053 to Myers et al. entitled "Heat Treating Process for Semiconductor Fabrication", the yield of devices from a semiconductor wafer is increased by determining the critical temperature gradient that causes stress above the yield point of the semiconductor material and controlling both the rate of heating and cooling so that the temperature gradient is lower than the critical temperature gradient. Similar forms of ramp up/ramp down temperature cycles have been widely adopted for controlling wafer cracking or warping. However, no relation has been recognized between the ramp up/ramp down form of temperature cycle and the rate of oxygen precipitation.

DISCLOSURE OF THE INVENTION

It is a principal object of this invention to provide an improved method of manufacturing a semiconductor wafer.

It is another object of the invention to provide a method of manufacturing a semiconductor wafer wherein oxygen precipitation in the semiconductor wafer is reduced.

It is a further object of the invention to provide a method for controlling oxygen precipitation in a semiconductor wafer by controlling the form of the semiconductor heat treatment steps during the manufacture of semiconductor circuits.

These and other objects are accomplished by heat treating the semiconductor wafer using a quick insertion/ramp down form of temperature cycle. Quick insertion may be accomplished by preheating a furnace to the requisite heat treatment temperature, directly inserting the wafer into the preheated furnace, and maintaining the wafer therein for the requisite heat treatment time. Alternatively, if a rapid heating furnace having a heat-up rate greater than several hundred degrees centigrade per second is employed, the equivalent to quick insertion may be achieved by inserting the wafer into the furnace, rapidly heating the furnace to the requisite heat treating temperature, and maintaining the wafer therein for the requisite heat treatment time. Ramp down may be accomplished by slowly cooling the wafer at a rate less than about 15° C./minute at the end of the requisite heat treatment time. Alternatively, if the wafer surface is allowed to cool down uniformly, so as to prevent the occurrence of temperature gradients thereon, cooling may occur at a more rapid rate.

We have discovered that oxygen precipitation is dramatically reduced by minimizing the wafer heat-up time via quick insertion. By reducing oxygen precipitation, a precipitation free zone at the wafer surface is ensured. Moreover, wafer cracking or warping is prevented by ramping down at the end of the heat treatment process. Thus, by merely changing the prior art ramp up/ramp down form of temperature cycle to a quick insertion/ramp down form of temperature cycle, high oxygen content wafers that were previously unusable for high performance devices may now be successfully used.

BEST MODE FOR CARRYING OUT THE INVENTION

Figure 1:
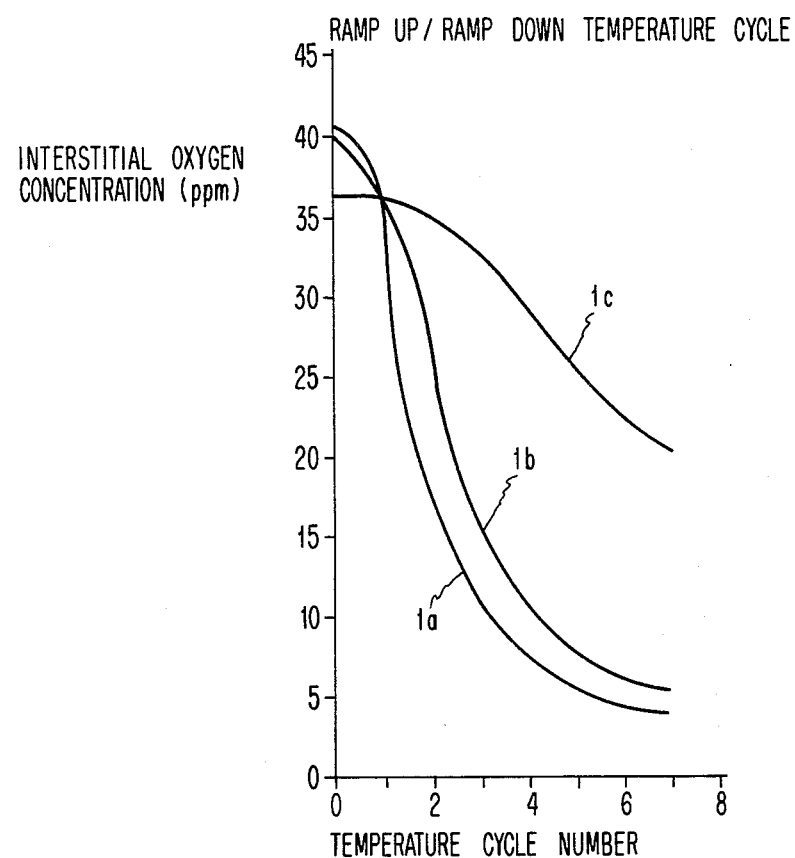
FIG. 1 is a plot of interstitial oxygen concentration as a function of temperature cycle number for a prior art ramp up/ramp down form of temperature cycle.
Figure 3:
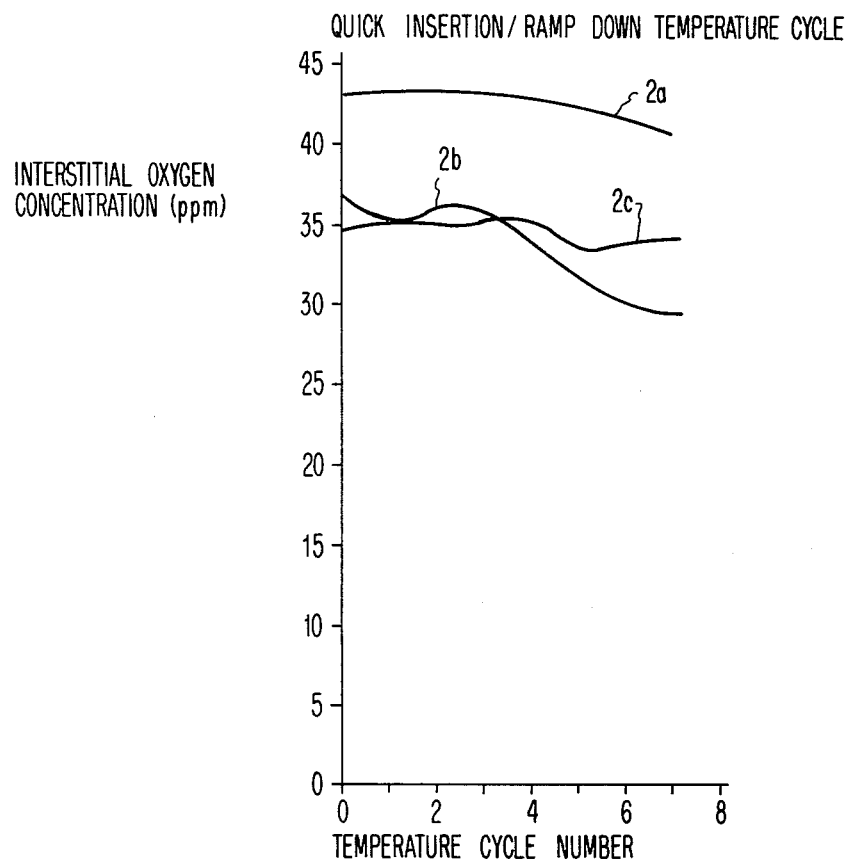
FIG. 3 is a plot of interstitial oxygen concentration as a function of temperature cycle number for a quick insertion/ramp down form of temperature cycle of the present invention.

Referring now to the drawing, FIGS. 1 and 3 are plots of interstitial oxygen concentration in silicon wafers as a function of temperature cycle number. The wafers employed to obtain the data of FIGS. 1 and 3 were all [100] silicon, 11–16 ohm/cm, Czochralski grown, 100 mm diameter, 0.4 mm thick, double side polished wafers. The wafers used for obtaining curves 1a, 1b and 1c were obtained from the same crystals as the wafers for curves 2a, 2b and 2c, respectively. The furnace employed for the tests of FIGS. 1 and 3 was a Thermco Brute American XL having a 24 inch flat temperature zone, although any other furnace commonly used in semiconductor wafer processing could have been employed. Nitrogen gas was used as the ambient flowing through the furnace at one liter/min.

Figure 2:
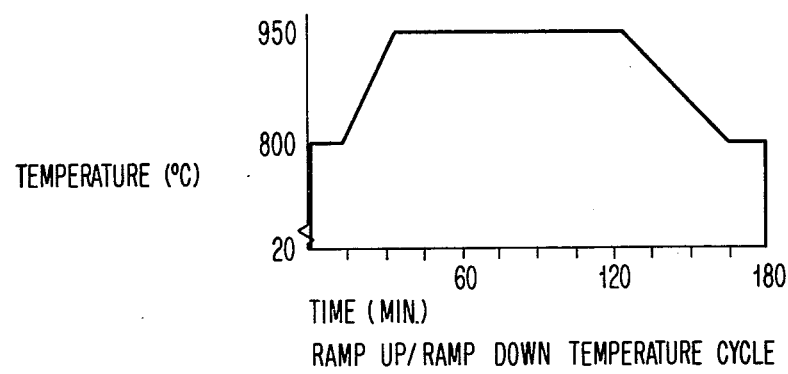
FIG. 2 illustrates the prior art ramp up/ramp down form of temperature cycle used to obtain the data of FIG. 1.

The data shown in FIG. 1 was obtained by subjecting three wafers to a typical prior art ramp up/ramp down temperature cycle illustrated in FIG. 2. As shown in FIG. 2, the wafers were inserted into the furnace at 800° C. and maintained at 800° C. for 15 minutes. The wafers were then slowly ramped up to 950° C. at a rate of 7.5°/min for 20 minutes. The wafers were then heat treated at 950° C. for 90 minutes and ramped down to 800° C. at a rate of 3.25°/min for 40 minutes. The wafers were then maintained at 800° C. for 15 minutes.

Figure 4:
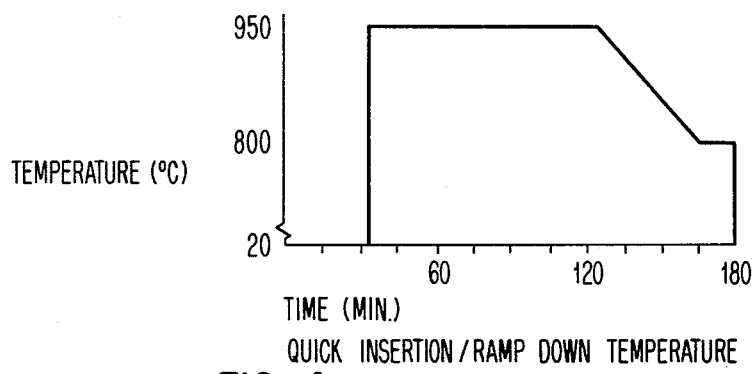
FIG. 4 illustrates the quick insertion/ramp down form of temperature cycle used to obtain the data of FIG. 3.

The wafers for obtaining the data of FIG. 3 were subject to a quick insertion/ramp down temperature cycle illustrated in FIG. 4. As shown in FIG. 4, the wafers were quickly inserted into a furnace preheated to 950° C. Once in the furnace, the wafers were heat treated and ramped down in the same way as the FIG. 2 temperature cycle. In fact, the experiments for obtaining the data in FIGS. 1 and 3 were run in the same furnace simultaneously by inserting the wafers of FIG. 3 into the furnace after the furnace temperature had reached 950° C.

Interstitial oxygen concentration was measured in parts per million (ppm) using Fourier Transform Infrared Spectroscopy, a common method of measuring oxygen concentration in a semiconductor wafer. However, any other infrared spectroscopy method or other method could have been used to measure interstitial oxygen concentration. The amount of precipitated oxygen after a given number of temperature cycles may be obtained by subtracting the interstitial oxygen concentration after the given number of temperature cycles from the initial interstitial oxygen concentration. For example, referring to FIG. 1, the amount of oxygen precipitated from the wafers of curves 1a, 1b and 1c after seven heat treatment cycles is approximately 35, 35, and 15 ppm, respectively.

Referring now to FIG. 3, the dramatic decrease in oxygen precipitation as a result of the quick insertion/ramp down temperature cycle is illustrated. For example, the oxygen precipitated at the end of seven heat treatment cycles of wafers 2a, 2b and 2c is approximately 2, 7 and 0 ppm, respectively. This is a dramatic decrease compared to the ramp up/ramp down results described above. Moreover, the wafers of FIG. 3 did not exhibit a greater degree of warpage or cracking compared to the wafers of FIG. 1.

From the data presented in FIGS. 1 and 3 it is apparent that oxygen precipitation is affected by the wafer heat up rate. Quick insertion minimizes heat-up time by inserting the wafer into a preheated furnace. Alternatively, heat-up time may be minimized by employing a furnace having a rapid heat up rate, i.e., a heat up rate greater than a few hundred degrees per second. An example of such a furnace is a radiant heated epireactor. When such a furnace is employed, the equivalent to quick insertion may be achieved by inserting the wafer into the furnace and rapidly heating the furnace to the requisite heat treating temperature. A plot of the rapid heat up/ramp down form of temperature cycle is identical with the quick insertion/ramp down plot of FIG. 4, as the rapid heat up (i.e., greater than several hundred °/sec) is almost instantaneous when compared with prior art ramp up rates which are typically less than 15°/min and more typically only a few degrees/min.

It is also apparent that wafer warpage and cracking primarily occurs during the cool down portion of the temperature cycle and not during heat up. Warpage and cracking occur as a result of local temperature gradients across the surface of the wafer during cool down. Thus, if the wafer is allowed to cool down slowly, i.e., at a rate less than about 15°/min, the local temperature gradients are kept below the value that induces unacceptable warpage and cracking. Alternatively, the wafer may be cooled down more rapidly than 15°/min if heat is uniformly removed from the wafer surface so that local temperature gradients are avoided. Uniform cooling may be accomplished when wafers are laid down in a furnace, rather than closely spaced in an upright manner, so that heat may be uniformly dissipated from the exposed surface of the wafer.

The quick insertion/ramp down form of temperature cycle of the present invention may be employed for all heat treatment steps to retard oxygen precipitation. The use of the temperature cycle of the present invention is especially important for heat treatment steps occurring above about 800° C. where precipitation effects are most pronounced. It has been found that the greatest precipitation retardation occurs when the quick insertion/ramp down temperature cycle is used in the early, e.g., the first three, heat treatment steps of wafer processing. If the quick insertion/ramp down temperature cycle is used in the early heat treatment steps, it has been found that oxygen precipitation in the wafer will be retarded for the duration of the wafer processing steps, even if subsequent heat treatment steps employ a ramp up/ramp down form of temperature cycle. Precipitation will even be retarded if the quick insertion/ramp down form of temperature cycle is used for the first heat treatment step and all subsequent heat treatment steps employ ramp up/ramp down.

While the quick insertion/ramp down temperature cycle has been described as being incorporated into one or more wafer heat treatment steps, it may also be performed as one or more separate processing steps, at the beginning of wafer fabrication, to retard oxygen precipitation during subsequent heat treatment steps. Thus, semiconductor wafers may be subjected to one or more quick insertion/ramp down temperature cycles at the early stages of fabrication, without any wafer processing occurring at the heat treatment temperature, in order to reduce oxygen precipitation during subsequent high temperature processing steps.

As is well known to those having skill in the art, various heat treatment techniques are currently employed in wafer processing. Four representative heat treatment techniques will now be described to illustrate how the form of temperature cycle of the present invention may be incorporated therein.

1. Open boat technique—A discussion of the open boat technique for thermal treatment of semiconductor wafers may be found in U.S. Pat. No. 3,737,282 to Hearn et al., assigned to the assignee of the present invention, the disclosure of which is incorporated herein by reference. Specifically, referring to FIG. 1 of the Hearn et al patent, a series of closely spaced upright wafers is mounted in an open cylindrical holder. Quick insertion may be obtained with the open boat by preheating the furnace to the processing temperature and then quickly inserting the open boat into the furnace. Ramp down may be obtained by slowing withdrawing the open boat from the furnace or by slowing lowering the furnace temperature.

2. Closed boat: FIG. 2 of the above referenced Hearn et al patent discloses the closed boat technique wherein the closely spaced upright wafers are mounted in a closed cylindrical holder so that a circumferential heat mask is formed around the wafers. Quick insertion may be obtained with the closed boat technique by preheating the furnace to the processing temperature and inserting the closed boat into the furnace. Ramp down may be obtained by slowly withdrawing the closed boat from the furnace or turning the furnace temperature down slowly. Alternatively, ramp down may be obtained by rapidly withdrawing the closed boat from the furnace, as the circumferential heat mask formed by the closed boat will act as a heat retaining insulator, and permit slow cooling of the wafers enclosed within the boat.

3. Horizontal conveyor: Wafers may be laid down on a horizontal conveyor which passes through a furnace. Quick insertion may be obtained by ensuring that the furnace opening is maintained at the processing temperature and directly inserting the semiconductor wafer into the furnace. Ramp down may be obtained by slowly lowering the temperature of the furnace, slowly withdrawing the wafer from the furnace or providing a decreasing temperature along the length of the furnace. It has also been found that the surface of the laid down wafers will uniformly cool and may thus be rapidly removed from the furnace without suffering from excessive warpage or cracking.

4. Radiant heated furnace: Heat treatment may also be accomplished in a furnace whose elevated temperatures are obtained by a radiant heat, e.g., an epi-reactor. Such a radiant heated epi-reactor is disclosed in U.S. Pat. No. 3,623,712 to McNeilly et al. the disclosure of which is incorporated herein by reference. Disclosed is a cold wall epitaxial reactor in which the requisite heat treatment temperature is attained via a bank of tungsten filament quartz-iodine high intensity lamps. When such a furnace is employed, minimum heat-up time may be obtained without preheating the furnace. The wafers may be inserted into the epi-reactor while it is at room temperature. The temperature may then be rapidly (i.e., a few hundred degrees per second) raised to the heat treatment temperature and maintained there for the requisite time. Ramp down may be accomplished by slowly lowering the radiant heater's temperature. Alternatively, if the wafers are laid down in the radiant heater the wafers may be rapidly withdrawn therefrom and will not crack or warp.

The above examples illustrate how the temperature cycle of the present invention may be incorporated into four commonly used heat treatment techniques. As will be apparent to those having skill in the art many other heat treatment techniques and processes are known in which the present invention may be practiced. Regardless of the heat treating technique, oxygen precipitation may be reduced without producing wafer warpage by rapidly heating the wafer temperature to its heat treatment temperature, processing the wafer at its heat treatment temperature and cooling the wafer in a manner that prevents excessive thermal gradients in the wafer.

Whereas we have illustrated and described the preferred embodiment of the invention, it is to be understood that we do not limit ourselves to the precise construction herein disclosed and the right is reserved to all changes and modifications coming within the scope of the invention as defined by the appended claims.

We claim:

1. A method of retarding oxygen precipitation and preventing warpage in a semiconductor wafer which is subject to heat treatment at a predetermined temperature during the manufacture of semiconductor circuits thereon, comprising the steps of:
   preheating a furnace to the predetermined heat treatment temperature,
   inserting the wafer into the preheated furnace in a manner which immediately exposes said semiconductor wafer to said predetermined heat treatment temperature and causes said semiconductor wafer to rapidly heat up to said predetermined heat temperature,
   maintaining the furnace at said predetermined heat treatment temperature for about ninety minutes, and
   slowly cooling the wafer at the end of said heat treatment.

2. A method of retarding oxygen precipitation and preventing warpage in a semiconductor wafer which is subject to heat treatment at a predetermined temperature during the manufacture of semiconductor circuits thereon, comprising the steps of:
   inserting the wafer into a furnace, the temperature of which may be increased to the predetermined heat treatment temperature at a rate exceeding several hundred degrees centigrade per second,
   increasing the furnace temperature to the predetermined heat treatment temperature at a rate exceeding several hundred degrees centigrade per second to thereby increase the wafer temperature to the predetermined heat treatment temperature at a rate exceeding several hundred degrees centigrade per second,
   performing the heat treatment, and
   slowly cooling the wafer at the end of said heat treatment.

3. The method of claim 1 or 2 wherein the predetermined heat treatment temperature is greater than 800° C. and wherein the wafer is slowly cooled from the predetermined heat treatment temperature to below 800° C.

4. The method of claim 1 or 2 wherein the wafer is slowly cooled at a rate less than 15° C./minute.

5. A method of retarding oxygen precipitation in a semiconductor wafer having interstitial oxygen content greater than 33 parts per million, by performing the following sequence of steps prior to fabricating semiconductor circuits thereon:
   preheating a furnace to a temperature above 800° C.,
   inserting the wafer into the preheated furnace in a manner which immediately exposes the semiconductor wafer to the temperature of the preheated furnace and causes said semiconductor wafer to rapidly heat up to the temperature of the preheated furnace,
   maintaining the furnace at said temperature above 800° C. for about ninety minutes, and
   slowly cooling the wafer to below 800° C.

6. A method of retarding oxygen precipitation in a semiconductor wafer having interstitial oxygen content greater than 33 parts per million, by performing the following sequence of steps prior to fabricating semiconductor circuits thereon:
   inserting the wafer into a furnace, the temperature of which may be rapidly increased to a temperature above 800° C. at a rate exceeding several hundred degrees centigrade per second,
   rapidly increasing the furnace temperature to above 800° C. at a rate exceeding several hundred degrees centigrade per second to thereby increase the wafer to above 800° C. at a rate exceeding several hundred degrees centigrade per second, and
   slowly cooling the wafer to below 800° C.

7. A method of retarding oxygen precipitation in a semiconductor wafer having interstitial oxygen content greater than 33 parts per million, by performing the following sequence of steps prior to fabricating semiconductor circuits thereon:
   preheating a furnace to a temperature above 800° C.,
   inserting the wafer into the preheated furnace in a manner which immediately exposes the semiconductor wafer to the temperature of the preheated furnace and causes said semiconductor wafer to rapidly heat up to the temperature of the preheated furnace, and
   maintaining the furnace at said temperature above 800° C. for about ninety minutes, and
   uniformly cooling the wafer to below 800° C.

8. A method of retarding oxygen precipitation in a semiconductor wafer having interstitial oxygen content greater than about 33 parts per million, by performing the following sequence of steps prior to fabricating semiconductor circuits thereon:
   inserting the wafer into a furnace, the temperature of which may be rapidly increased to a temperature above 800° C. at a rate exceeding several hundred degrees centigrade per second,
   rapidly increasing the furnace temperature to above 800° C. at a rate exceeding several hundred degrees centigrade per second to thereby increase the wafer temperature to above 800° C. at a rate exceeding several hundred degrees centigrade per second, and uniformly cooling the wafer to below 800° C.

9. The method of claims 5, 6, 7 or 8 where the claimed sequence of steps is performed on the semiconductor wafer three times prior to fabricating semiconductor circuits thereon.

10. A method of retarding oxygen precipitation and preventing warpage in a semiconductor wafer which is subject to heat treatment at a predetermined temperature during the manufacture of semiconductor circuits thereon, comprising the steps of:
    preheating a furnace to the predetermined heat treatment temperature,
    inserting the wafer into the preheated furnace in a manner which immediately exposes said semiconductor wafer to said predetermined heat treatment temperature and causes said semiconductor wafer to rapidly heat up to said predetermined heat temperature,
    maintaining the furnace at said predetermined heat treatment temperature for about ninety minutes, and
    uniformly cooling the wafer at the end of said heat treatment.

11. A method of retarding oxygen precipitation and preventing warpage in a semiconductor wafer which is subject to heat treatment at a predetermined temperature during the manufacture of semiconductor circuits thereon, comprising the steps of:

inserting the wafer into a furnace, the temperature of which may be increased to the predetermined heat treatment temperature at a rate exceeding several hundred degrees centigrade per second, increasing the furnace temperature to a predetermined heat treatment temperature at a rate exceeding several hundred degrees centigrade per second to thereby increase the wafer temperature to the predetermined heat treatment temperature at a rate exceeding several hundred degrees centigrade per second, performing the heat treatment, and uniformly cooling the wafer at the end of said heat treatment.

12. The method of claims 10 or 11 wherein the predetermined heat treatment temperature is greater than 800° C. and wherein the wafer is uniformly cooled from the predetermined heat treatment to below 800° C.

* * * * *